US008059836B2

(12) United States Patent
Lou

(10) Patent No.: US 8,059,836 B2
(45) Date of Patent: Nov. 15, 2011

(54) MICROPHONE BIAS CIRCUITS

(75) Inventor: Chih-Hong Lou, Yilan County (TW)

(73) Assignee: Mediatek Inc., Hsin-Chu (TW)

( * ) Notice: Subject to any disclaimer, the term of this patent is extended or adjusted under 35 U.S.C. 154(b) by 938 days.

(21) Appl. No.: 12/034,672

(22) Filed: Feb. 21, 2008

(65) Prior Publication Data

US 2009/0214057 A1    Aug. 27, 2009

(51) Int. Cl.
*H04R 3/00* (2006.01)

(52) U.S. Cl. .......................... 381/111; 381/113

(58) Field of Classification Search ............... 381/111, 381/113
See application file for complete search history.

(56) References Cited

U.S. PATENT DOCUMENTS

| | | | | |
|---|---|---|---|---|
| 5,036,536 A | * | 7/1991 | Hanon et al. ............... | 379/395 |
| 5,577,129 A | * | 11/1996 | Ehara ........................ | 381/113 |
| 5,631,968 A | * | 5/1997 | Frey et al. .................. | 381/106 |
| 5,838,804 A | * | 11/1998 | Holthaus et al. ........... | 381/111 |
| 6,222,928 B1 | * | 4/2001 | Downs et al. .............. | 381/111 |
| 6,275,112 B1 | * | 8/2001 | Muza .......................... | 330/296 |
| 7,116,163 B2 | * | 10/2006 | Kappes ....................... | 330/69 |
| 7,372,967 B2 | * | 5/2008 | Henson et al. ............. | 381/111 |
| 7,391,873 B2 | * | 6/2008 | Deruginsky et al. ....... | 381/113 |
| 7,929,716 B2 | * | 4/2011 | Niwa et al. ................. | 381/113 |

* cited by examiner

*Primary Examiner* — Luan C Thai

(74) *Attorney, Agent, or Firm* — Thomas|Kayden

(57) ABSTRACT

A microphone bias circuit is disclosed. A current source provides a first current. A voltage buffer provides a first reference voltage. A microphone coupled between the current source and the first reference voltage receives acoustic waves and converts the received acoustic waves to a second current. A loading device coupled between the current source and a second reference voltage lower than the first reference voltage outputs an output voltage according to the first current and the second current.

19 Claims, 6 Drawing Sheets

MICROPHONE BIAS CIRCUITS

BACKGROUND OF THE INVENTION

1. Field of the Invention

The invention relates to a bias circuit, and in particular to a bias circuit for biasing a hands-free module comprising a microphone and a headphone.

2. Description of the Related Art

FIG. 1 shows a conventional microphone bias circuit 10. An amplifier 12 is coupled to and drives a transistor 14, which is an NMOS transistor. The output voltage $V_{OUT}$ is generated at the source of the transistor 12, and the maximum the output voltage $V_{OUT}$ can reach is approximately $(V_{DD}-V_{GS}-V_{DS})$.

For a microphone bias circuit, low output impedance may be desired, which typically involves using a source-follower output stage, e.g. class AB amplifier. FIG. 2 shows a conventional source-follower amplifier circuit 20. Rather than the NMOS transistor shown in FIG. 1, a PMOS transistor is used for the transistor 24 so the output voltage $V_{out}$ increases close to the positive voltage $V_{DD}$. However, the efficiency of the half source-follower amplifier circuit 20 is poor because current $I_1$ must be the maximum amount regardless of current $I_{LOAD}$ draw from the load, which in telecom applications typically varies from zero to 1.3 mA to support up to the external electret microphones, for example. The source-follower amplifier circuit 20 requires a certain amount of current $I_1$ from the power supply $V_{DD}$ and also requires a wide voltage range to work properly.

In a source-follower amplifier circuit such as the one shown in FIG. 2, the output $V_{OUT}$ tracks the input at $V_{IN}$. If the input $V_{IN}$ goes high, the output $V_{OUT}$ also goes high. FIG. 2 is a class A type design which requires the current $I_1$ to be set to the maximum load current $I_{LOAD}$ plus the current necessary to bias transistor 24 correctly. Even if $I_{LOAD}$ is removed, current $I_1$ is still set to its maximum level, thus using 1-2 mA of current unnecessarily. Also, using a conventional 2-stage common-source amplifier 22 with a PMOS transistor 24 as the output device to obtain high output voltage and good efficiency creates a relatively high output impedance and poor PSRR (Power Supply Rejection Ratio). A large amount of semiconductor space is required for the compensation capacitor (not shown) coupled to the output. Another disadvantage of the conventional source-follower amplifier circuit 20 is that the output impedance is approximately equal to the output transconductance Gm of the transistor 24. A higher current $I_1$ is required to accommodate the higher transconductance Gm.

FIG. 3 shows another conventional microphone bias amplifier circuit 30 as disclosed in U.S. Pat. No. 6,275,112. The output stage 32 of conventional microphone bias amplifier circuit 30 includes source-follower transistor 36 coupled to feedback loop 34 that keeps the source-follower transistor 36 current constant. The microphone of a cellular phone may be integrated in a hands-free module. A mono hands-free module comprises an earphone terminal, a microphone terminal, and a ground terminal, while a stereo hands-free module comprises right and left audio channel terminals, an earphone terminal, a microphone terminal, and a ground terminal. Note the earphone and microphone modules share the common ground terminal as their grounding.

The output of an audio buffer, which drives audio channels, is coupled to the headphone by alternating current (AC) coupling to block direct current (DC). However, some audio signals with low frequency are also suppressed. To solve this problem, a capacitor with large capacitance can be employed in the AC coupling stage to lower the high pass cut-off frequency below about 20 Hz. However, the large capacitor increases the size and cost of the circuit.

Another solution is to drive the headphone using DC coupling, wherein a reference voltage VCM exceeding the ground voltage is provided to the common ground terminal as the grounding for the headphone. However, since the earphone and microphone modules share the common ground terminal as their grounding, the voltage difference across the microphone module is decreased while replacing the ground voltage by the reference voltage VCM. As the system voltage becomes decreased, the voltage difference across the microphone module may not support the operation of the microphone module.

BRIEF SUMMARY OF INVENTION

Microphone bias circuits are provided. An exemplary embodiment of a microphone bias circuit comprises a current source providing a first current, a voltage buffer providing a first reference voltage, a microphone coupled between the current source and the first reference voltage receiving acoustic waves and converting the received acoustic waves to a second current, and a loading device coupled between the current source and a second reference voltage lower than the first reference voltage and outputting an output voltage according to the first current and the second current.

Another exemplary embodiment of a microphone bias circuit comprises: a voltage buffer providing a first reference voltage; a driving circuit providing a bias voltage according to a first input voltage, a second input voltage and a second reference voltage, which is lower than the first reference voltage; a microphone coupled between the first reference voltage and the bias voltage, receiving acoustic waves and converting the received acoustic waves to a sensing current; and a loading device coupled between the driving circuit and microphone, outputting a first output voltage according to the bias voltage and the sensing current.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
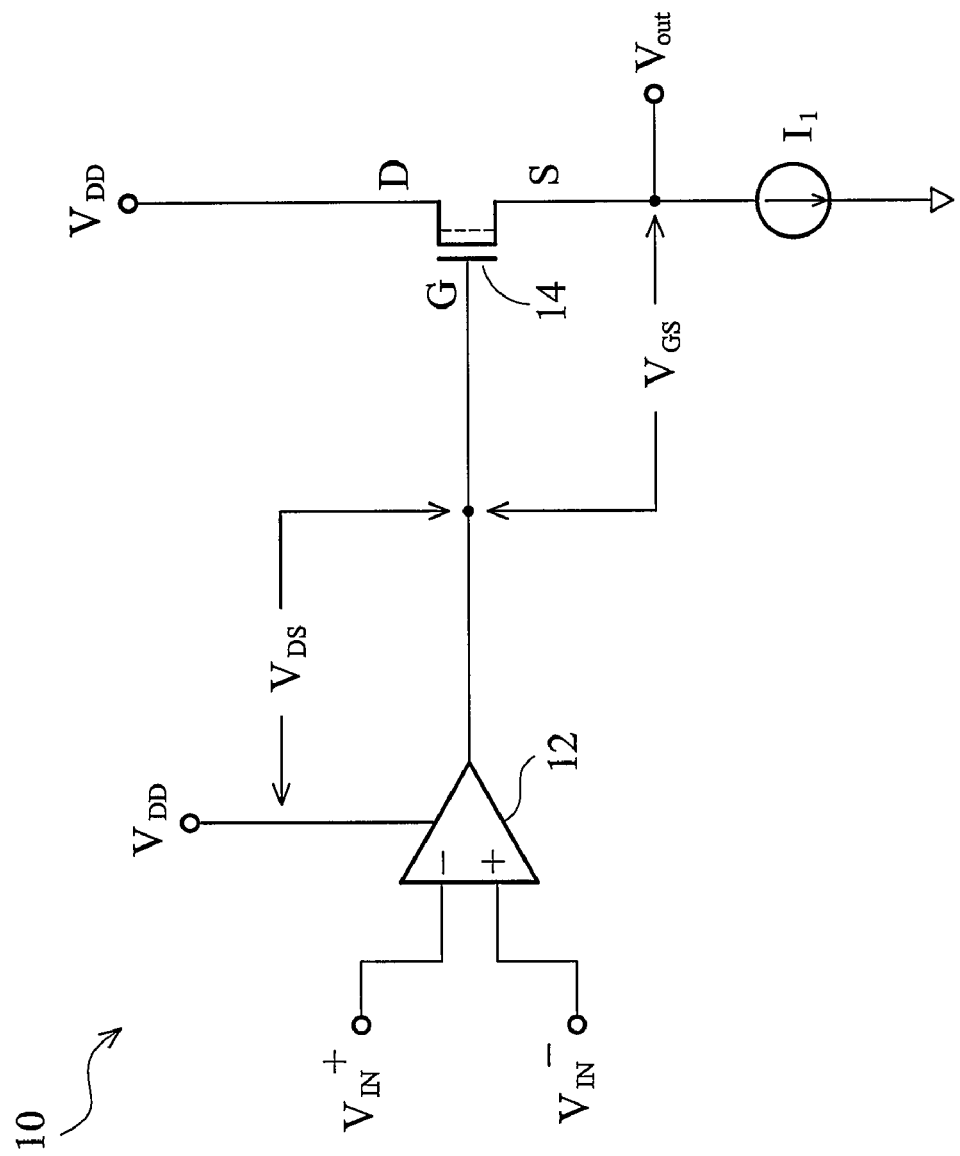
FIG. 1 shows a conventional microphone bias circuit.
Figure 2:
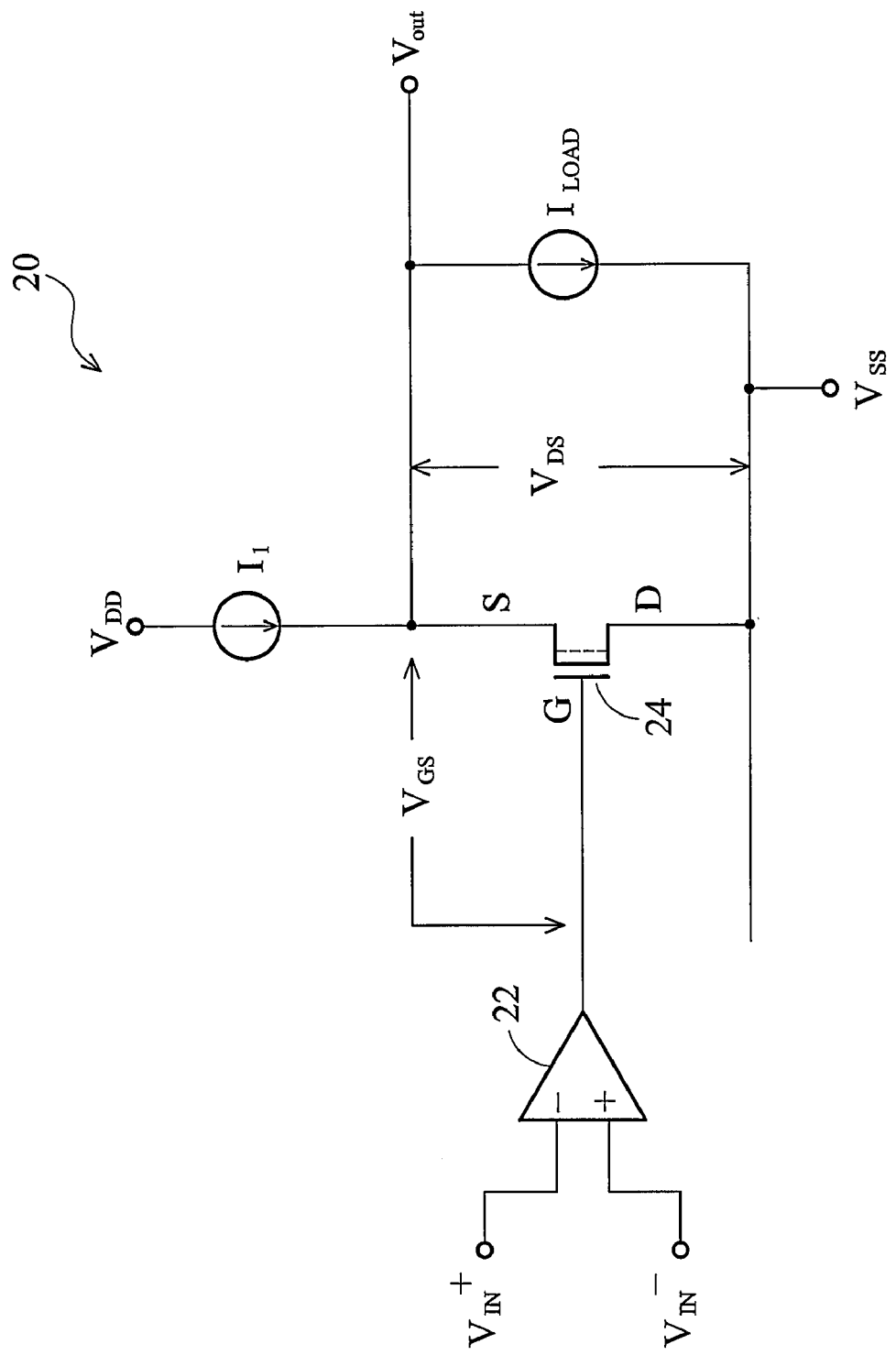
FIG. 2 shows another conventional microphone bias circuit.
Figure 3:
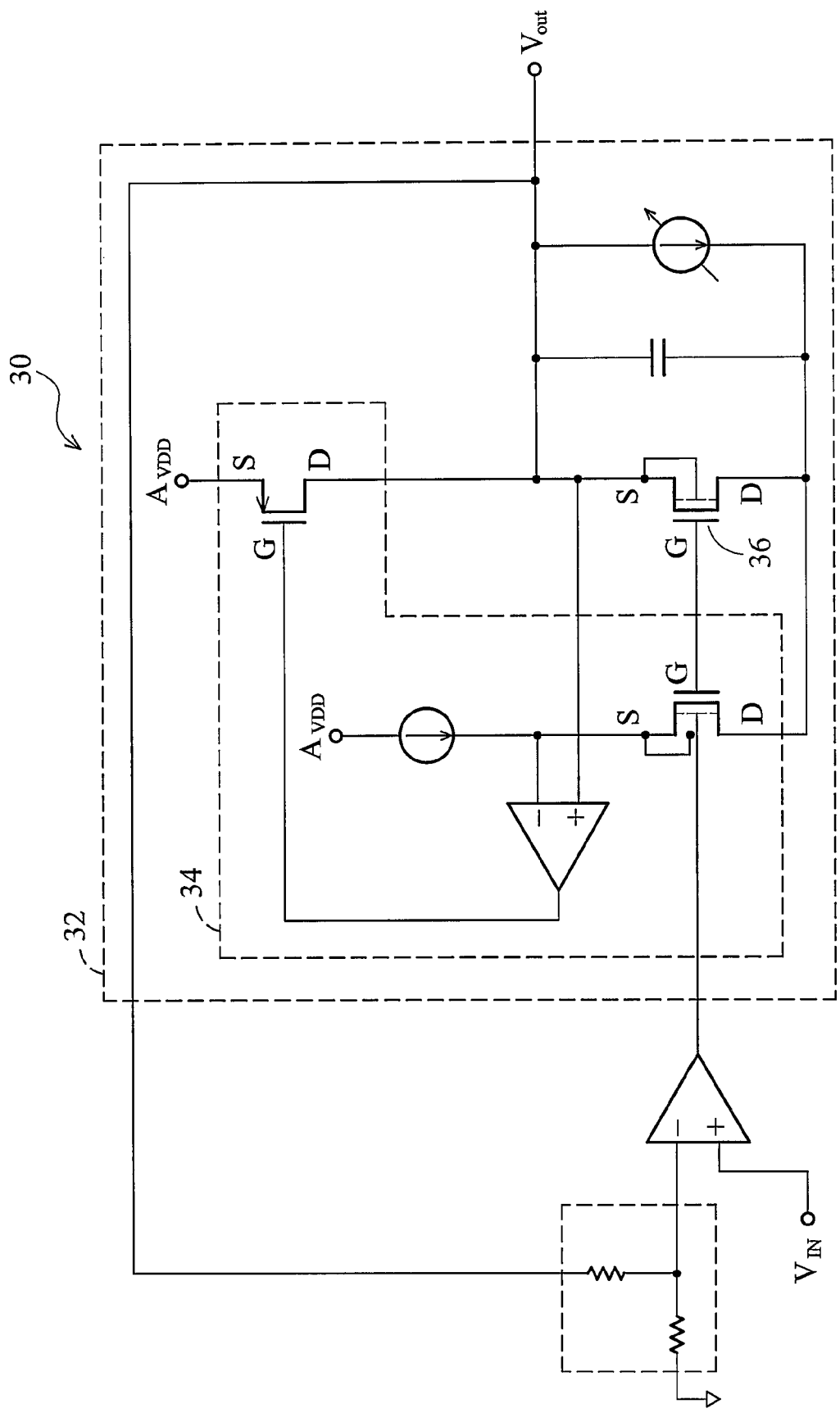
FIG. 3 shows another conventional microphone bias amplifier circuit disclosed in U.S. Pat. No. 6,275,112.
Figure 4:
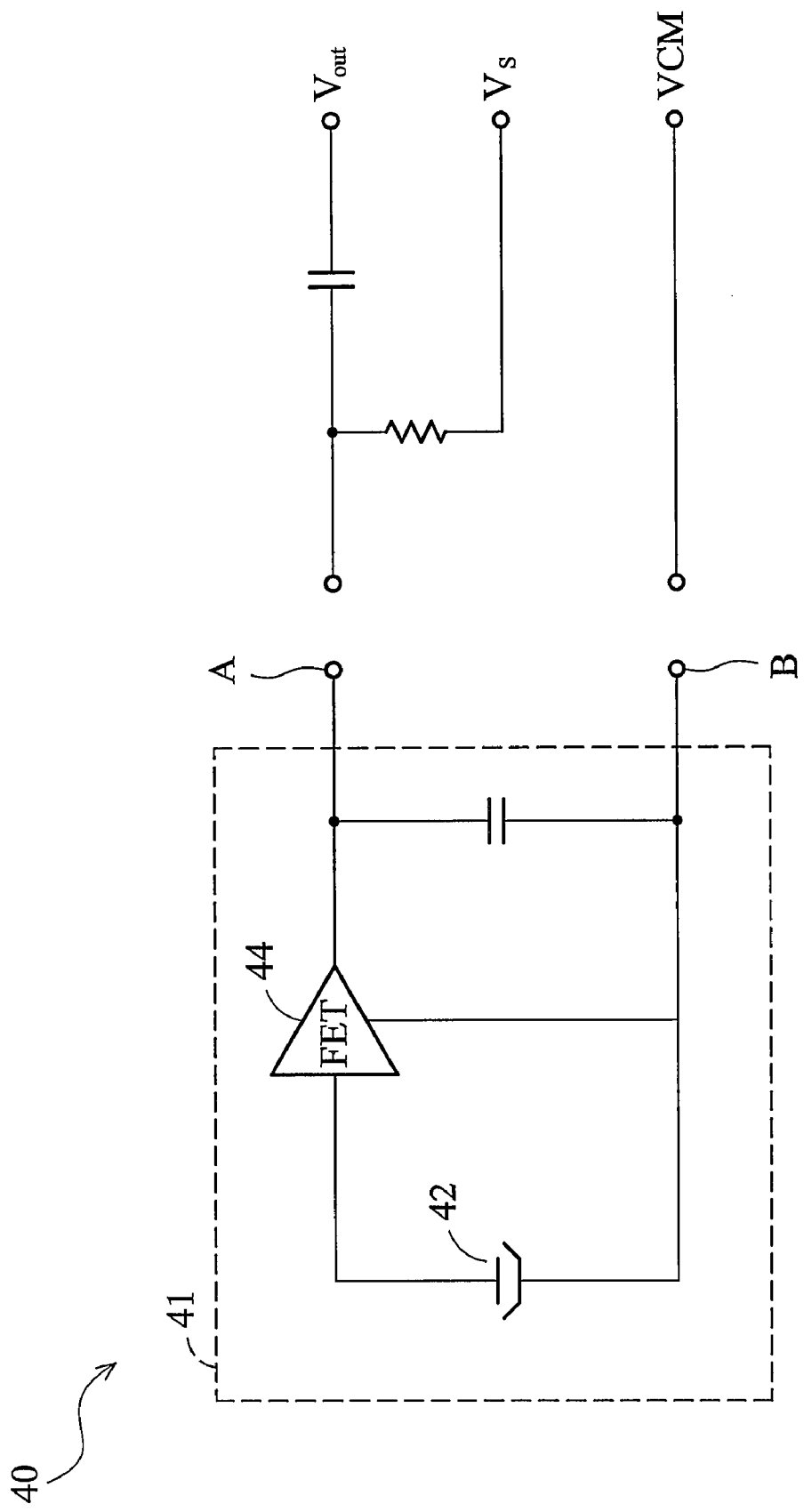
FIG. 4 is a circuit diagram of an electret condenser microphone.

FIG. 4 is a circuit diagram of a microphone 40, e.g. an electret condenser microphone (ECM), comprising a shield case 41, ECM unit 42, and impedance converter 44. Here, the circuit connection in microphone 40 is a resistor loaded common source amplifier. ECM unit 42 is a fixed-charge capacitor, where charges in the ECM unit 42 are trapped and fixed. The movement of the plate results in a change in capacitance value of the capacitor when one plate of the capacitor moves in response to sound waves, e.g. the moving pressure waves.

Because the total charge of ECM unit 42 is conserved, an equation can be obtained as:

$$Q = C \cdot V = \frac{k}{t} \cdot V = \text{constant, thus } V = \text{constant} \cdot \frac{t}{k}, \text{ where}$$

$Q$ represents total charges trapped in ECM unit 42, $C$ represents capacitance of ECM unit 42, $k$ represents dielectric constant, and $t$ represents the distance between both plates of ECM unit 42.

Therefore, the movement t of the plate results in a voltage difference V across ECM unit 42. Impedance converter 44 can be a junction field effect transistor (JFET), which amplifies the voltage difference V across ECM unit 42 and outputs a corresponding current at terminal A. In an embodiment of the invention, terminal A is connected to the supply voltage Vs, and terminal B is connected to a reference voltage VCM, which exceeds the known ground voltage GND.

Figure 5:
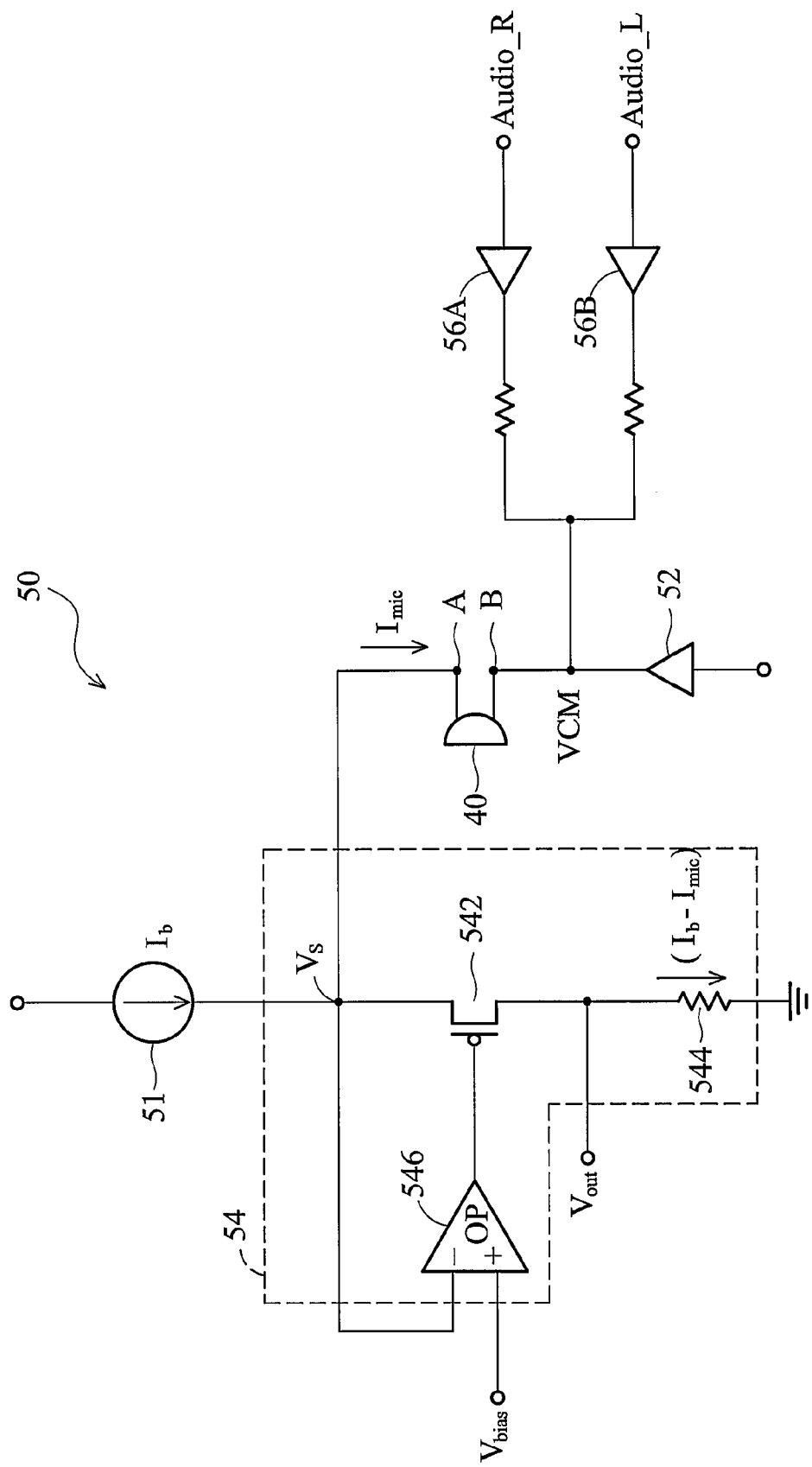
FIG. 5 is a circuit diagram of a microphone bias circuit according to an embodiment of the invention.

FIG. 5 is a circuit diagram of a microphone bias circuit 50 according to an embodiment of the invention. Microphone bias circuit 50 is a folded cascade amplifier circuit, comprising a current source 51, a voltage buffer 52, a microphone 40, e.g. the ECM, and a loading device 54. Current source 51 provides a first current $I_b$. Voltage buffer 52 provides a reference voltage VCM, which exceeds the known ground voltage GND. In an embodiment of the invention, reference voltage VCM can be about half of a system voltage. Microphone 40 is coupled between current source 51 and the reference voltage VCM, and receives acoustic waves and converts the received acoustic waves to a second current $I_{mic}$. In addition, audio buffers 56A and 56B are also connected to voltage buffer 52, and powered by reference voltage VCM to drive an earphone. Here, audio buffer 56A drives a right audio channel Audio_R of the earphone, and audio buffer 56B a left audio channel Audio_L.

In addition, a loading device 54 is coupled between current source 51 and ground voltage GND lower than reference voltage VCM, and outputs an output voltage $V_{out}$ according to a difference between first current $I_b$ and second current $I_{mic}$. In an embodiment of the invention, loading device 54 comprises a PMOS transistor 542, a resistor 544, and an operational amplifier 546. PMOS transistor 542 and resistor 544 are connected in serial. In addition, PMOS transistor 542 operates may be a saturation region, for example. Operational amplifier 554 comprises an inverting input terminal coupled to a connecting point of microphone 40 and PMOS transistor 542, a non-inverting input terminal receiving a bias voltage $V_{bias}$, and an output terminal coupled to gate of PMOS transistor 542. The connection of operational amplifier 554 and PMOS transistor 542 forms a regulated cascade local feedback loop. Thus, voltage level of the connecting point of microphone 40 and PMOS transistor 542, the supply voltage Vs provided to terminal A of the microphone 40, is latched at the bias voltage $V_{bias}$. In addition, resistance of the connecting point of microphone 40 and PMOS transistor 542 is decreased by the regulated cascade local feedback loop.

Using the current directions shown in FIG. 5 as an example, output voltage $V_{out}$ at the connecting point of PMOS transistor 542 and resistor 544 is the voltage difference across resistor 544 generated by the difference between first current $I_b$ and second current $I_{mic}$ through resistor 544. Thus, the response of second current $I_{mic}$ is transferred to resistor 544 and amplified. According to the embodiment of the microphone bias circuit shown in FIG. 5, microphone 40 and audio buffers 56A and 56B are commonly connected to reference voltage VCM, instead of the ground voltage GND. Thus, the headphone is driven by DC coupling to avoid loss of low frequency signal, and microphone 40 still obtains sufficient operating margin with low voltage difference across its both terminals, adapting low voltage systems.

Figure 6:
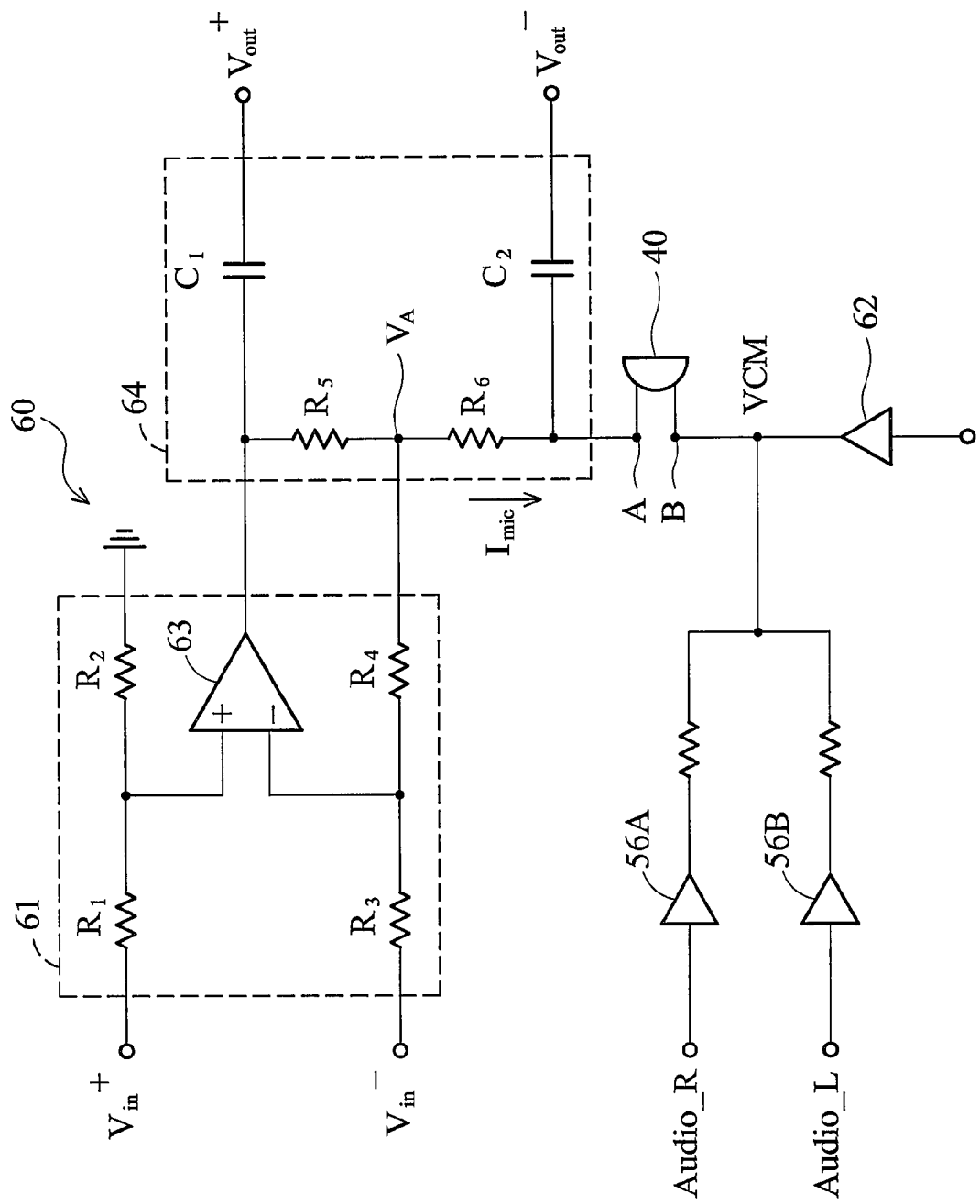
FIG. 6 is a circuit diagram of a microphone bias circuit according to another embodiment of the invention.

FIG. 6 is a circuit diagram of a microphone bias circuit 60 according to another embodiment of the invention. Microphone bias circuit 60 comprises a driving circuit 61, a voltage buffer 62, a microphone 40, and a loading device 64. Driving circuit 61 provides a bias voltage $V_A$ at a connecting point of resistors R5 and R6 according to a first input voltage $V_{in}^+$, a second input voltage $V_{in}^-$, and a ground voltage GND. In one example, difference between the first input voltage $V_{in}^+$ and the second input voltage $V_{in}^-$ may be fixed, and bias voltage $V_A$ is thus a DC voltage. In addition, driving circuit 61 comprises first resistor R1 coupled to first input voltage $V_{in}^+$, second resistor R2 coupled between first resistor R1 and ground voltage GND, third resistor R3 coupled to second input voltage $V_{in}^-$, and fourth resistor R4 coupled to third resistor R3, and an operational amplifier 63. Operational amplifier 63 comprises a non-inverting input terminal coupled to the connecting point of first resistor R1 and second resistor R2, an inverting input terminal coupled to the connecting point of third resistor R3 and fourth resistor R4, and an output terminal coupled to loading device 64. In one example, a ratio of the resistances of first resistor R1 to second resistor R2 may be the same as that of third resistor R3 to fourth resistor R4.

Loading device 64 is coupled to driving circuit 61 and outputs the output voltages $V_{out}^+$ and $V_{out}^-$ according to bias voltage $V_A$ and a sensing current $I_{mic}$. Loading device 64 may comprise fifth resistor R5 coupled between fourth resistor R4 and the output terminal of operational amplifier 63, and sixth resistor R6 coupled between fourth resistor R4 and microphone 40. The resistances of fifth resistor R5 and sixth resistor R6 can be the same or different. In addition, capacitor C1 is connected between fifth resistor R5 and output voltages $V_{out}^+$, and capacitor C2 is connected between sixth resistor R6 and output voltages $V_{out}^-$ to block DC signals. Note that the voltage level of the connection point of fifth resistor R5 and sixth resistor R6 is the bias voltage $V_A$ provided by driving circuit 61.

Voltage buffer 62 provides a reference voltage VCM, which exceeds the ground voltage GND. In an embodiment of the invention, reference voltage VCM can be about half of a system voltage. Microphone 40 is coupled between loading device 64 and reference voltage VCM, and receives acoustic waves and converts the received acoustic waves to a sensing current $I_{mic}$. In addition, audio buffers 56A and 56B are also connected to voltage buffer 62, and are powered by reference voltage VCM to drive an earphone. Here, audio buffer 56A drives the right audio channel Audio_R of the earphone, and audio buffer 56B the left audio channel Audio_L.

Using the current direction shown in FIG. 6 as an example, the value of output voltage $V_{out}^+$ is bias voltage $V_A$ plus the voltage difference across fifth resistor R5 generated by sensing current $I_{mic}$, and the value of output voltage $V_{out}^-$ is bias voltage $V_A$ minus the voltage difference across sixth resistor R6 generated by sensing current $I_{mic}$. According to the embodiment shown in FIG. 6, microphone 40 and audio buffers 56A and 56B are commonly connected to reference voltage VCM, rather than the ground voltage GND. Thus, the headphone is driven by DC coupling to avoid loss of low frequency signal, and microphone 40 still obtains sufficient operation margin with low voltage difference across its both terminals, adapting low voltage systems.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A microphone bias circuit, comprising:
    a current source providing a first current;
    a voltage buffer providing a first reference voltage;
    a microphone coupled between the current source and the first reference voltage, receiving acoustic waves and converting the received acoustic waves to a second current; and
    a loading device coupled between the current source and a second reference voltage lower than the first reference voltage, outputting an output voltage according to the first current and the second current.

2. The microphone bias circuit as claimed in claim 1, wherein the loading device comprises a MOS transistor and a resistor coupled in serial, and the MOS transistor operates in a saturation region.

3. The microphone bias circuit as claimed in claim 2, wherein a connecting point of the MOS transistor and the resistor outputs the output voltage.

4. The microphone bias circuit as claimed in claim 2, wherein the loading device further comprises an operational amplifier having an inverting input terminal coupled to a connecting point of the microphone and the MOS transistor, a non-inverting input terminal receiving a bias voltage, and an output terminal coupled to a gate of the MOS transistor.

5. The microphone bias circuit as claimed in claim 4, wherein a voltage level of the connecting point of the microphone and the MOS transistor is latched at the bias voltage.

6. The microphone bias circuit as claimed in claim 1, wherein the microphone is an electret condenser microphone.

7. The microphone bias circuit as claimed in claim 1, further comprising an audio buffer coupled to a connecting point of the microphone and the voltage buffer, and the audio buffer is driven by the first reference voltage.

8. The microphone bias circuit as claimed in claim 1, wherein the first reference voltage is about half a system voltage, and the second reference voltage is a ground voltage.

9. A microphone bias circuit, comprising:
    a voltage buffer providing a first reference voltage;
    a driving circuit providing a bias voltage according to a first input voltage, a second input voltage and a second reference voltage, wherein the second reference is lower than the first reference voltage;
    a microphone coupled between the first reference voltage and the bias voltage, receiving acoustic waves, and converting the received acoustic waves to a sensing current; and
    a loading device coupled between the driving circuit and the microphone, and outputting a first output voltage according to the bias voltage and the sensing current.

10. The microphone bias circuit as claimed in claim 9, wherein the driving circuit comprises:
    a first resistor coupled to the first input voltage;
    a second resistor coupled between the first resistor and the second reference voltage;
    a third resistor coupled to the second input voltage;
    a fourth resistor coupled between the third resistor and the bias voltage; and
    an operational amplifier having a non-inverting input terminal coupled to a connecting point of the first resistor and the second resistor, an inverting input terminal coupled to a connecting point of the third resistor and the fourth resistor, and an output terminal coupled to the loading device.

11. The microphone bias circuit as claimed in claim 10, wherein the loading device comprises:
    a fifth resistor coupled between the output terminal of the operational amplifier and the fourth resistor; and
    a sixth resistor coupled between the fifth resistor and the microphone.

12. The microphone bias circuit as claimed in claim 11, wherein a voltage level of a connection of the fifth resistor and the sixth resistor is the bias voltage.

13. The microphone bias circuit as claimed in claim 11, wherein the loading device comprises:
    a first output terminal for outputting the first output voltage;
    a second output terminal for outputting a second output voltage;
    a first capacitor coupled between the second output terminal and a connecting point of the fifth resistor and the output terminal of the operational amplifier; and
    a second capacitor coupled between the sixth resistor and the first output terminal.

14. The microphone bias circuit as claimed in claim 11, wherein the resistance of the fifth resistor is the same as that of the sixth resistor.

15. The microphone bias circuit as claimed in claim 10, wherein a ratio of the resistances of the first resistor to the second resistor is the same as that of the third resistor to the fourth resistor.

16. The microphone bias circuit as claimed in claim 9, wherein a difference between the first input voltage and the second input voltage is fixed.

17. The microphone bias circuit as claimed in claim 9, wherein the microphone is an electret condenser microphone.

18. The microphone bias circuit as claimed in claim 9, further comprising an audio buffer coupled to a connecting point of the microphone and the voltage buffer, and the audio buffer is driven by the first reference voltage.

19. The microphone bias circuit as claimed in claim 9, wherein the first reference voltage is about half of a system voltage and the second reference voltage is a ground voltage.

* * * * *